United States Patent
Kawamata

(10) Patent No.: US 6,418,076 B2
(45) Date of Patent: Jul. 9, 2002

(54) SEMICONDUCTOR MEMORY DEVICE UTILIZING ACCESS TO MEMORY AREA LOCATED OUTSIDE MAIN MEMORY AREA

(75) Inventor: Junya Kawamata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/772,074

(22) Filed: Jan. 30, 2001

(30) Foreign Application Priority Data

Feb. 29, 2000 (JP) ........................................ 2000-054824

(51) Int. Cl.$^7$ ................................................ G11C 8/00

(52) U.S. Cl. ........................... 365/230.06; 365/230.01; 365/230.03; 365/185.11; 365/226

(58) Field of Search ...................... 365/230.01, 189.01, 365/230.03, 230.06, 226, 185.01, 185.11

(56) References Cited

U.S. PATENT DOCUMENTS

| | | | | |
|---|---|---|---|---|
| 4,974,208 A | * | 11/1990 | Nakamura et al. | 365/228 |
| 5,317,717 A | * | 5/1994 | Cutler et al. | 395/425 |
| 5,592,662 A | * | 1/1997 | Fandrich et al. | 395/430 |
| 5,749,088 A | * | 5/1998 | Brown et al. | 711/115 |
| 6,266,271 B1 | * | 7/2001 | Kawamura | 365/185.04 |
| 6,266,273 B1 | * | 7/2001 | Conley et al. | 365/185.11 |
| 6,339,815 B1 | * | 1/2002 | Feng et al. | 711/163 |

FOREIGN PATENT DOCUMENTS

JP 2000133765 * 11/2001

* cited by examiner

Primary Examiner—Viet Q. Nguyen
(74) Attorney, Agent, or Firm—Arent Fox Kintner Plotkin & Kahn

(57) ABSTRACT

A semiconductor memory device is provided. The semiconductor memory device includes a primary memory area including a plurality of memory blocks arranged in rows and columns, the plurality of memory blocks including a predetermined memory block; a secondary memory area including a hidden memory block situated in the same column as the predetermined memory block; a decision circuit selecting one of a first mode for reading first data from the primary memory area and a second mode for reading second data from the secondary memory area, the decision circuit outputting a signal when the second mode and an address of the predetermined memory block are specified; a column decoder selecting a column corresponding to a column address inputted thereto; and a word-line decoder selecting a word line of the hidden memory block by boosting a word line of an adjacent memory block included in the primary memory area in response to the signal, the word-line decoder being included in the adjacent memory block, wherein the second data is read from the hidden memory block when the column decoder and the word-line decoder select the column corresponding to the hidden memory block and the word line of the hidden memory block respectively. According to the present invention, the semiconductor memory device enables efficient selection of an address of the secondary memory area with a simple circuit structure.

6 Claims, 8 Drawing Sheets

SEMICONDUCTOR MEMORY DEVICE UTILIZING ACCESS TO MEMORY AREA LOCATED OUTSIDE MAIN MEMORY AREA

BACKGROUND OF THE INVENTION

1. Field of the Invention

The present invention generally relates to a semiconductor memory device, and more particularly relates to a nonvolatile memory device in which data can be electrically written and erased.

2. Description of the Related Art

Recently, a flash EEPROM (Electrically Erasable and Programmable ROM) has been developed mainly as a semiconductor memory device in which data can be electrically written and erased. The flash EEPROM is referred to as a flash memory hereinafter. FIG. 1 is a block diagram showing a flash memory. In the flash memory shown in FIG. 1, a memory-cell array is divided into a plurality of erasable units, each of the erasable units being called a block. Blocks 0 through 10 are placed in the memory-cell array forming a matrix structure of the blocks. Additionally, one of the blocks placed in the matrix structure is divided into a plurality of units called boot blocks. Boot blocks 0 through 7 are arranged so that the boot blocks 0 through 7 can correspond to the blocks placed in the memory-cell array.

The matrix structure of the blocks includes an empty space where no block is placed therein. A memory area called a hidden block 12 provided outside a main memory area is placed in the empty space. The hidden block 12 stores, for instance, product information about the flash memory shown in FIG. 1. Since the hidden block 12 is placed outside the main memory area, the flash memory does not have an address used for selecting the hidden block 12. Thus, in a case of selecting the hidden block 12, the following steps are performed by the flash memory. A hidden-mode command is initially inputted to a command register 14 of the flash memory, thereby shifting an operation mode of the flash memory to a hidden mode. In the hidden mode, all the accesses to the main memory area are prohibited. Subsequently, the hidden block 12 is selected by temporarily using an address regularly used for selecting a block in the main memory area. It should be noted that a column selecting method is shared between the hidden block 12 and other blocks in the main memory area for preventing increase in a chip size of the flash memory. For instance, in the hidden mode, a block-selecting decoder 16 unselects the blocks 0 through 10 and the boot blocks 0 through 7 even if a block address is inputted to the block-selecting decoder 16. In addition, the block-selecting decoder 16 deactivates X-decoders of the blocks 0 through 10 and of the boot blocks 0 through 7. Furthermore, the block-selecting decoder 16 activates only an X-decoder of the hidden block 12 and the vertical block V0 including the hidden block 12, thereby selecting the hidden block 12.

FIG. 2 is a block diagram showing another flash memory. A segmental word line method is adapted to a word line decoding method in the flash memory shown in FIG. 2. In the segmental word line method, a horizontal direction (a horizontal block) and a vertical direction (a vertical block) are selected respectively by a global X-decoder and a local X-decoder in the flash memory. When an operation mode of the flash memory shown in FIG. 2 is shifted to the hidden mode, both the horizontal and vertical directions become not selectable. Additionally, only a local X-decoder of the hidden block 12 is activated. A column corresponding to the hidden block 12 is selected by activating only the vertical block V0 including the hidden block 12 similarly to the above-described flash memory shown in FIG. 1.

With recent low-voltage technology advancement, data cannot be read from a memory cell provided in a block at a gate level equal to a voltage level of a power source. Consequently, with such advancement, a flash memory including a technology to boost a word line voltage above the voltage level of the power source is recently found in an increasing number. The boosted voltage is supplied to a power source of an X-decoder of a block selected by boosted-voltage supply circuits P0 through P10, and SP0 through SP7, each of the boosted-voltage supply circuits being provided to its corresponding block. The hidden block 12 similarly includes a boosted-voltage supply circuit HP. When the operation mode of the flash memory is shifted to the hidden mode, only the boosted-voltage supply circuit HP of the hidden block 12 is activated, and supplies the boosted voltage to a power source of an X-decoder corresponding to the hidden block 12. A value of the boosted voltage is determined by a ratio of a capacitance of a capacitor used for boosting a voltage to a load capacitance measured from a voltage-boosting circuit 22 to a word line. If the load capacitance decreases, the value of the boosted voltage increases. Since a size of the hidden block 12 is often much smaller than the size of a block in the main memory area, the value of the boosted voltage at the power source of the X-decoder corresponding to the hidden block 12 is higher than the boosted voltage at the block when both the hidden block 12 and the block in the main memory area use the same capacitor for boosting voltage.

Recently, there has been a market demand for a flash memory that can store a command used for shifting from a hidden mode to a regular mode therein. In other words, a structure of such a flash memory should be designed so that a block in a main memory area can be selected in the hidden mode. However, as describe above, the hidden block does not have its own address, and thus a method of selecting the hidden block is necessary. Accordingly, a method as describe below has been suggested. Since all the blocks in the main memory area are not necessarily used in the hidden mode, one of the blocks and boot blocks provided in the main memory area is swapped logically with the hidden block, and thus the hidden block can be selected by use of an address of one of the blocks and the boot blocks provided in the main memory area. In other words, the hidden block is selected if the address of one of the blocks and the boot blocks that has been swapped with the hidden block is inputted in the hidden mode. Additionally, if a block address other than the address of the swapped block or boot block is inputted, a block or a boot block corresponding to the block address is selected. By setting any block or any boot block logically swapped with the hidden block, the hidden block can obtain its memory address. However, a circuit structure of the flash memory must be designed so that only the hidden block can be selected, but not the block or the boot block logically swapped with the hidden block, thereby causing increase in the size of a flash memory chip and in a period for developing such a flash memory chip.

In addition, a flash memory whose supply voltage is 3 V has become mainstream in production of flash memories recently. Thus, such flash memory must include a voltage-boosting circuit for boosting voltage at a word line corresponding to each block therein. A value of the boosted voltage depends on the load capacitance as describe above. Since a memory area of the hidden block is much smaller than that of blocks in the main memory area, a value of the boosted voltage supplied to the hidden block is much higher than the boosted voltage supplied to the blocks in the main memory area. As the value of the boosted voltage supplied to the hidden block becomes high, a possibility of data stored in memory cells of the hidden block being damaged such by a charge gain increases. Accordingly, reliability of data stored in the hidden block is lost. On the other hand, by decreasing the value of the boosted voltage supplied to the hidden block to a voltage level at which the reliability of the data stored in the hidden block is not lost, data cannot be read from a block located in the main memory area when the block is selected, since the boosted voltage becomes too low.

One of methods to solve the above-described problem is to provide a capacitor for boosting a voltage for each of the hidden block and the blocks in the main memory area, and to switch capacitors depending on an operation mode of the flash memory. By applying such a method to the flash memory, the boosted voltages for the hidden block and the blocks in the main memory area are stabilized. However, a time to set a capacitance of each capacitor is long. Additionally, an area size of a flash memory chip increases by providing separate capacitors to the flash memory. Furthermore, in a case of applying the segmental word line method to the flash memory, the boosted voltage is supplied to a global word line in addition to word lines, thereby affecting the value of the boosted voltage at word lines for the hidden block and the blocks in the flash memory.

SUMMARY OF THE INVENTION

Accordingly, it is a general object of the present invention to provide a semiconductor memory device enabling selection of an address of a memory area located outside a main memory area. A more particular object of the present invention is to provide a semiconductor memory device enabling efficient selection of an address of a memory area located outside a main memory area with a simple circuit structure, thereby shortening a period for developing the circuit structure of the semiconductor memory device and increasing reliability of operations at a low voltage.

The above-described object of the present invention is achieved by a semiconductor memory device including a primary memory area including a plurality of memory blocks arranged in rows and columns, the plurality of memory blocks including a predetermined memory block; a secondary memory area including a hidden memory block situated in the same column as the predetermined memory block; a decision circuit selecting one of a first mode for reading first data from the primary memory area and a second mode for reading second data from the secondary memory area, the decision circuit outputting a signal when the second mode and an address of the predetermined memory block are specified; a column decoder selecting a column corresponding to a column address inputted thereto; and a word-line decoder selecting a word line of the hidden memory block by boosting a word line of an adjacent memory block included in the primary memory area in response to the signal, the word-line decoder being included in the adjacent memory block, wherein the second data is read from the hidden memory block when the column decoder and the word-line decoder select the column corresponding to the hidden memory block and the word line of the hidden memory block respectively.

According to the present invention, the column corresponding to the hidden memory block can be selected just by inputting the address of the predetermined memory block because the hidden memory block and the predetermined memory block are logically swapped. Therefore, neither a change in a circuit structure nor an additional control circuit is necessary for selecting the column in the semiconductor memory device because of using the address of the predetermined memory block. Additionally, a memory block included in the primary memory area can be easily selected in the second mode with few modifications of the circuit structure in the semiconductor memory device.

Additionally, a load capacitance generated for reading data from the hidden memory block and a load capacitance generated for reading data from a memory block included in the primary memory area become substantially equal by sharing a word-line decoder of the adjacent memory block included in the primary memory area with the hidden memory block. Accordingly, a value of a boosted voltage used for reading data from the hidden memory block and a value of a boosted voltage used for reading data from a memory block included in the primary memory area can be equalized.

As described above, selection of a memory address of the secondary memory area is efficiently executed in the semiconductor memory device. Additionally, a period for designing such an efficient circuit structure of the semiconductor memory device is shortened. Furthermore, reliability of operations at a low voltage in the semiconductor memory device is increased.

Other objects, features and advantages of the present invention will become more apparent from the following detailed description when read in conjunction with the accompanying drawings.

DESCRIPTION OF THE PREFERRED EMBODIMENTS

A description will now be given of preferred embodiments of the present invention, with reference to the accompanying drawings.

Figure 1:
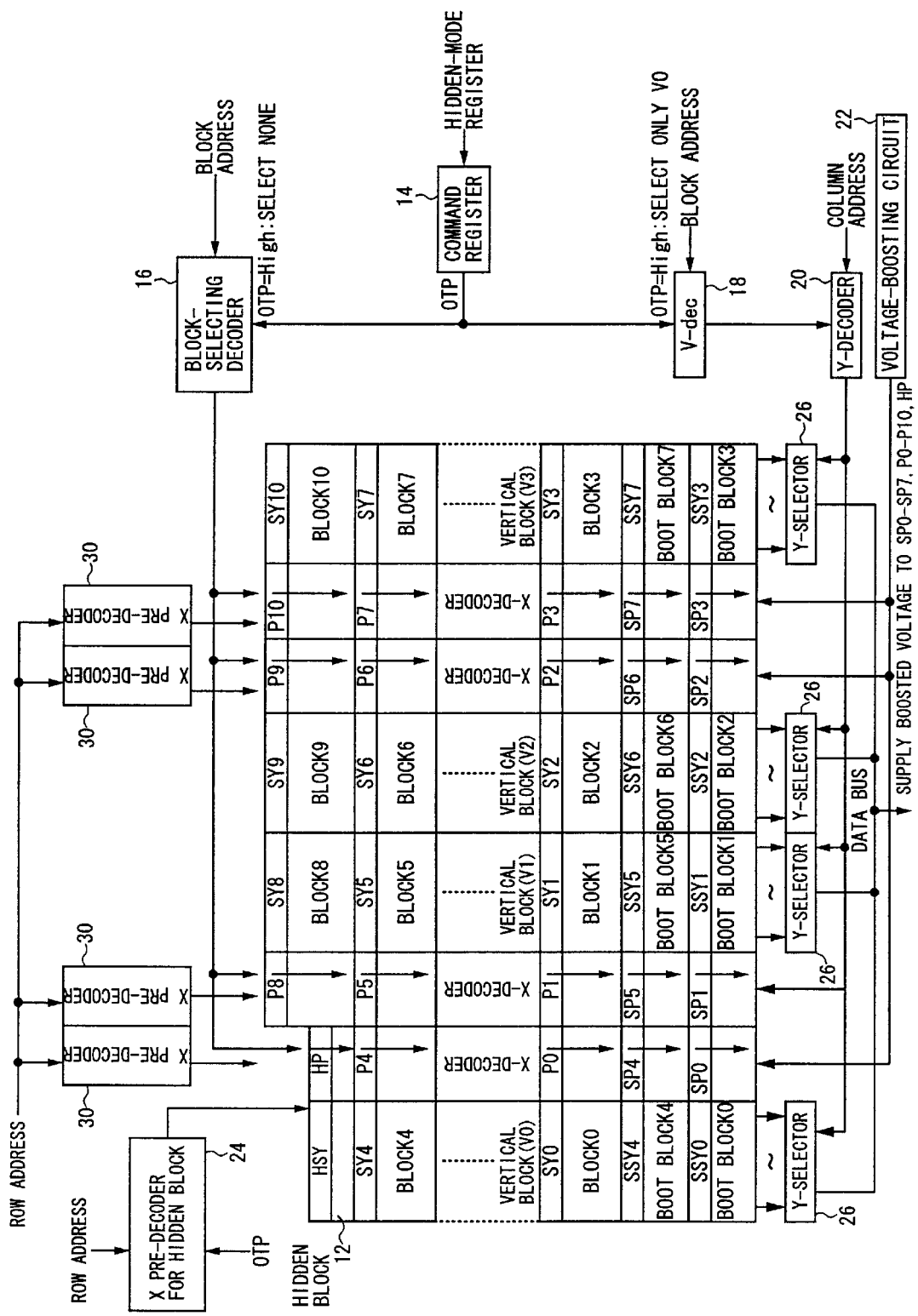
FIG. 1 is a block diagram showing a flash memory.
Figure 2:
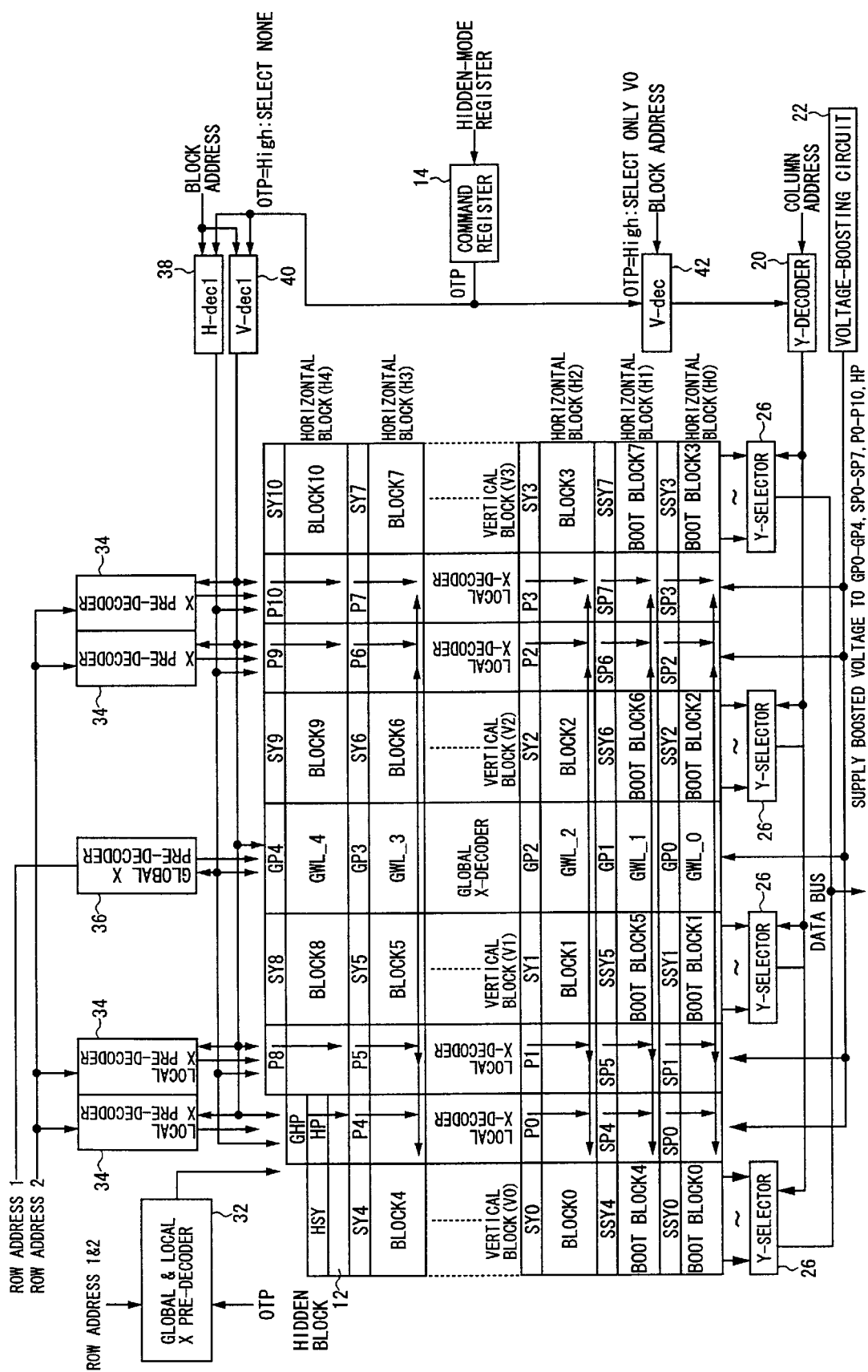
FIG. 2 is a block diagram showing another type of the flash memory.
Figure 3:
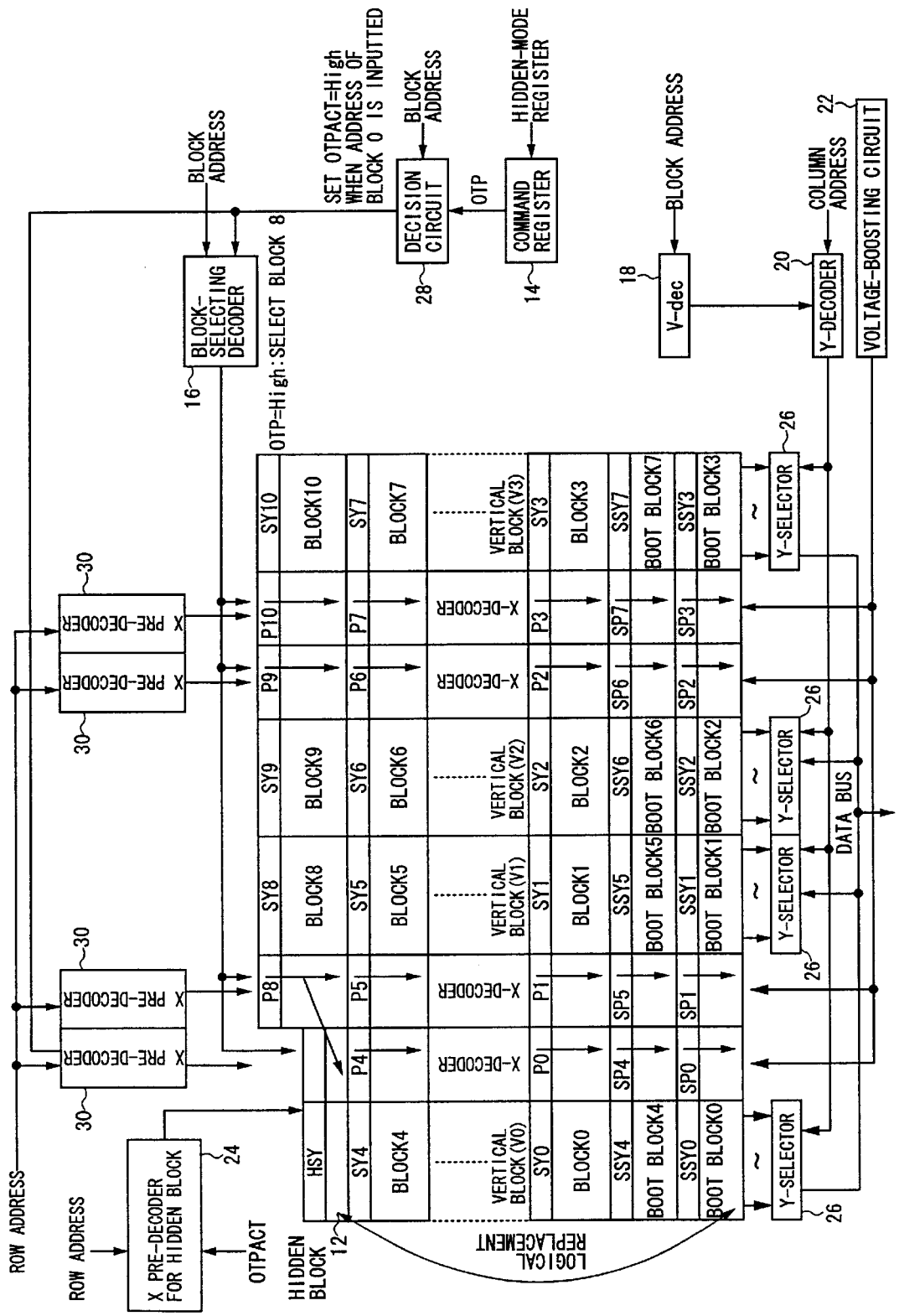
FIG. 3 is a block diagram showing a semiconductor memory device according to a first embodiment of the present invention.
Figure 4:
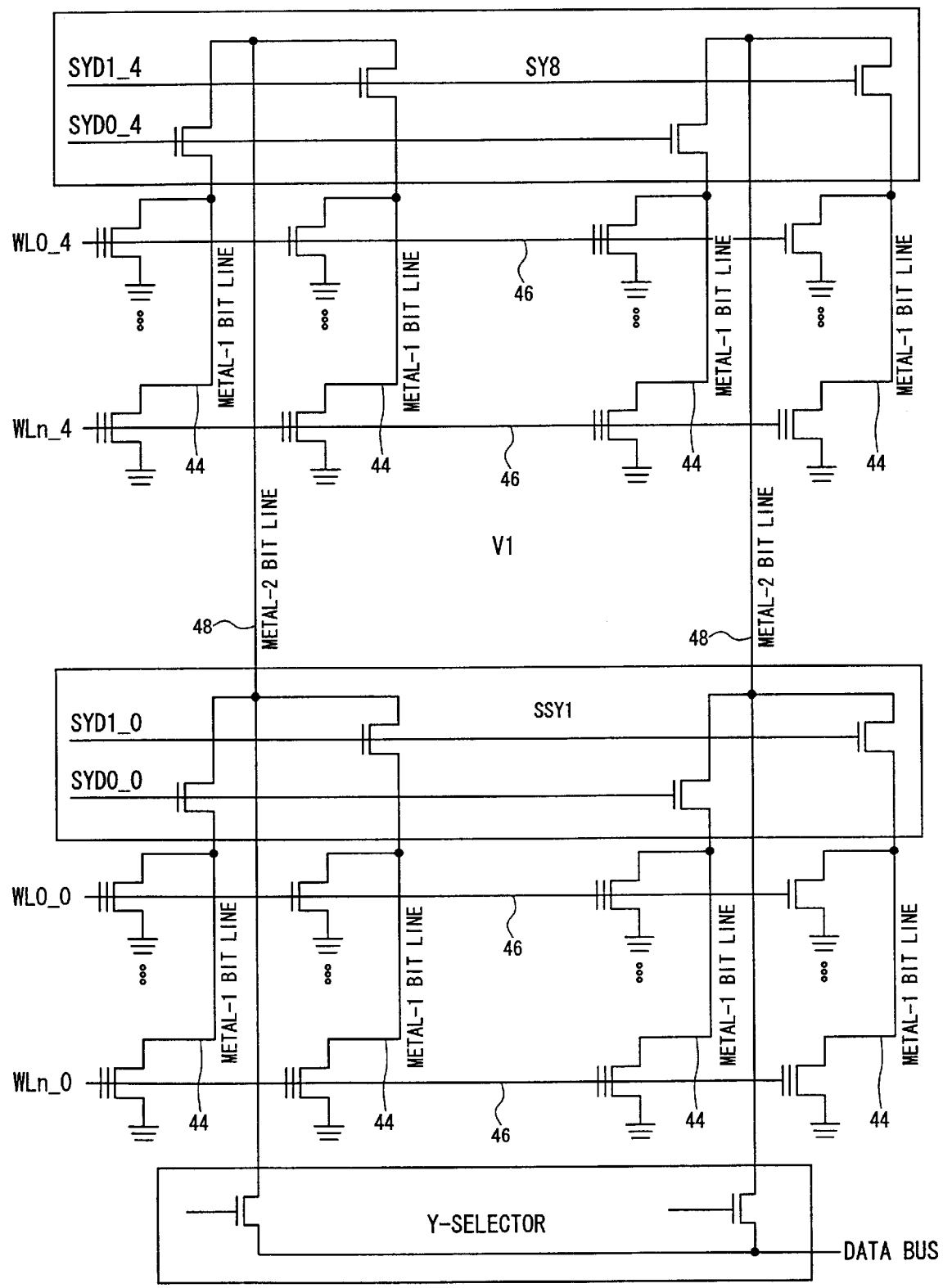
FIG. 4 is a circuit diagram showing a memory-cell array of a vertical block.

FIG. 3 is a block diagram showing a semiconductor memory device according to a first embodiment of the present invention. As described below, a description will be given of a flash memory as an embodiment of the semiconductor memory device according to the present invention. However, the present invention is not limited to the embodiment described below. The flash memory shown in FIG. 3 includes memory blocks in a 4×n matrix structure. A block provided at the top left corner of the matrix structure is evenly divided into boot blocks 0 through 7 that are arranged in a 4×2 matrix structure so as to correspond to the blocks. For instance, the boot blocks 0 and 4 are placed in the same column as blocks 0 and 4. A hidden block 12 is provided in an empty space in the matrix structure made by creating the boot blocks 0 through 7 so as to share a bit line with the blocks. The bit line shared between the hidden block 12 and the blocks is a bit line 48 provided on a second layer of a memory-cell array of a vertical block V1 shown in FIG. 4. As shown in FIG. 4, memory cells in each block of the memory-cell array are arranged in a matrix structure, and are connected to a bit line 44 (metal-1 bit line) and a work line 46 provided on a first layer. Two of the bit lines 44 are connected to the bit line 48 (metal-2 bit line) provided on the second layer through a switch such as a switch SY8 and a switch SSY1. The bit line 48 is shared among all the blocks in a vertical direction as shown in FIG. 4.

In the flash memory shown in FIG. 3, switches SY0 through SY10, SSY0 through SSY7, and HSY are selected by a block-selecting signal and a part of column addresses. A word line is included in each block, and is selected by the block-selecting signal and a row address of the block Each of the blocks and the boot blocks includes a boosted-voltage supply circuit for supplying a boosted voltage to an X-decoder when a block or a boot block is accessed for reading data stored therein. Boosted-voltage supply circuits P0 through P10, SP0 through SP7, and HP are provided in the flash memory shown in FIG. 3. The boosted-voltage supply circuit is activated only for a block that is selected by the block-selecting signal.

In a regular mode, an X pre-decoder 24 used for the hidden block 12 is deactivated so that a word line for the hidden block 12 cannot be selected. When reading data from a block in the regular mode, a block-selecting decoder 16 selects an X-decoder and a boosted-voltage supply circuit of the block by using a block address of the block. Meanwhile, a vertical-block selecting decoder (V-dec) 18 selects a vertical block corresponding to the block address, and then a Y-decoder 20 corresponding to the vertical block. The Y-decoder 20 selects a Y-selector 26 that corresponds to the vertical block selected according to its column address by the vertical-block selecting decoder 18. Once a data reading process at the selected block starts, a boosted voltage that has been generated by a voltage-boosting circuit 22 is supplied by the selected boosted-voltage supply circuit to the selected block. Data stored in a memory cell of the selected block is read by an increase in a voltage level of the word line corresponding to a row address of the block to a boosted voltage level, and is outputted from the memory cell of the block to a data bus through the Y-selector 26 of the vertical block selected by use of the column address of the block.

On the other hand, in a hidden mode, the hidden block 12 is logically swapped with a block located in the same column as the hidden block 12. The block to be swapped logically with the hidden block 12 is best located on the first row or the last row of the matrix structure for a user. Additionally, a memory capacity of the block should be smaller compared to other blocks so as to increase a memory capacity of a memory area provided for other use in the flash memory. Accordingly, the boot block 0 is selected for logically being swapped with the hidden block 12 in the first embodiment. Thus, blocks are arranged in the flash memory so that the hidden block 12 and the boot block 0 can be located in the same column.

Figure 5:
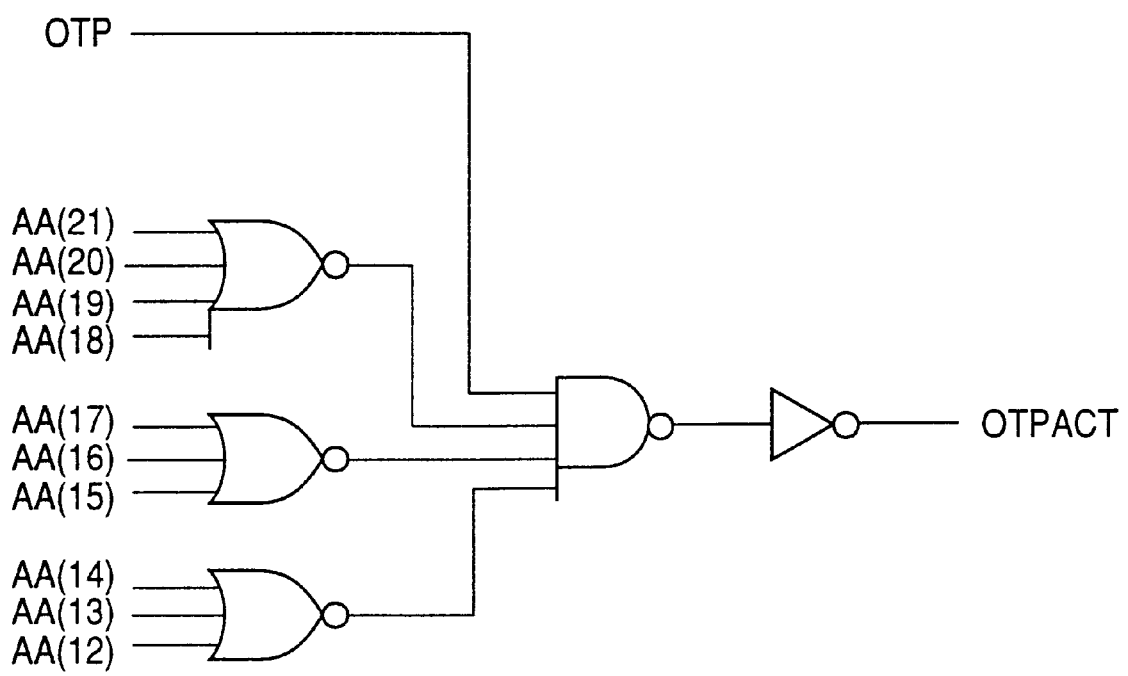
FIG. 5 is a circuit diagram showing a structure of a decision circuit.

The hidden block 12 is selected by inputting a hidden mode command to a command register 14, and then by inputting a block address of the boot block 0 to a decision circuit 28. FIG. 5 shows an embodiment of the decision circuit 28. When the block address of the boot block 0 from outside the flash memory, as well as a signal OTP set high indicating activation of the hidden mode from the command register 14, is inputted to the decision circuit 28 shown in FIG. 5, a signal OTPACT set high indicating selection of the hidden block 12 is outputted therefrom. The block-selecting decoder 16 selects the hidden block 12 after receiving the signal OTPACT set high from the decision circuit 28. Additionally, each X pre-decoder 30 is deactivated after receiving the signal OTPACT set high from the decision circuit 28. On the other hand, the X pre-decoder 24 for the hidden block 12 is activated after receiving the signal OTPACT set high from the decision circuit 28, and selects a word line for the hidden block 12 according to a row address of the hidden block 12.

When a block address other than the address of the boot block 0 and the signal OTP set high indicating the hidden mode from the command register 14 are supplied to the decision circuit 28, the signal OTPACT set high indicating the selection of the hidden block 12 is not outputted from the decision circuit 28. Consequently, a block corresponding to the block address is selected regularly. As described above, the boot block 0 and the hidden block 12 that have been logically swapped are located in the same column, and thus the hidden block 12 can be selected in a vertical direction by use of a regular block address.

The hidden block 12 does not include its own boosted-voltage supply circuit, and uses the boosted-voltage supply circuit P8 of the adjacent block 8. In other words, the boosted voltage is supplied from the voltage-boosting circuit 22 through the boosted-voltage supply circuit P8 to the X-decoder of the hidden block 12. In addition, a memory area of the hidden block 12 is small enough compared to that of the other blocks so that the load capacitance barely changes. Accordingly, the boosted voltage for reading data from the hidden block 12 and the boosted voltage for reading data from a block in the main memory area are approximately the same, and thus adjustment of a capacitor used for boosting a voltage can be easily executed.

Additionally, when reading data from the hidden block 12, the boosted-voltage supply circuit P8 is not activated since the vertical block V0 is selected. In such a case, the block-selecting decoder 16 is controlled so that the block 8 is selected following the signal OTPACT set high. Additionally, when the boosted-voltage supply circuit P8 is activated, the word line for the hidden block 12 and the word line for the block 8 are selected. To avoid selecting the word line for the hidden block 12 and the word line for the block 8 at the same time, the X pre-decoders 30 should be deactivated while the signal OTPACT set high is being outputted from the decision circuit 28. In a case of selecting the block 8 in the hidden mode, the X pre-decoder 24 for the hidden block 12 is deactivated since the decision circuit 28 does not output the signal OTPACT set high. In a case of selecting the block 8 in the regular mode, the vertical block V1 is selected, and thus data cannot be read from the hidden block 12.

As described above, the present invention enables selection of a block other than the hidden block 12 in the hidden mode with a small change in a circuit structure of the flash memory by placing the hidden block 12 in an empty part of a group of the blocks arranged in the matrix structure, and by logically swapping a block other than the hidden block 12 with the hidden block 12.

According to the first embodiment of the present invention, a column of the hidden block 12 can be selected just by inputting a block address of any block in the main memory area of the flash memory because of logically swapping the hidden block 12 and the block in the main memory area. Therefore, neither a change in the circuit structure nor an additional control circuit for selecting the column of the hidden memory 12 is necessary in the flash memory. Additionally, a block provided in the main memory area can be easily selected in the hidden mode with a few modifications of the circuit structure in the flash memory.

By placing the hidden block 12 in an empty space of the matrix structure of the blocks, a bit line can be shared between the hidden block 12 and a block in the main memory area, and thus the area size of the flash memory chip is reduced. Additionally, the load capacitance generated when reading data from the hidden block 12 and the load capacitance generated when reading data from a specific block, for example, the boot block provided in the main memory area, become substantially equal by sharing a power source for a word line of the specific block between the hidden block 12 and the specific block. Accordingly, a value of the boosted voltage used for reading data from the hidden block 12 and a value of the boosted voltage used for reading data from the specific block can be equalized.

Figure 6:
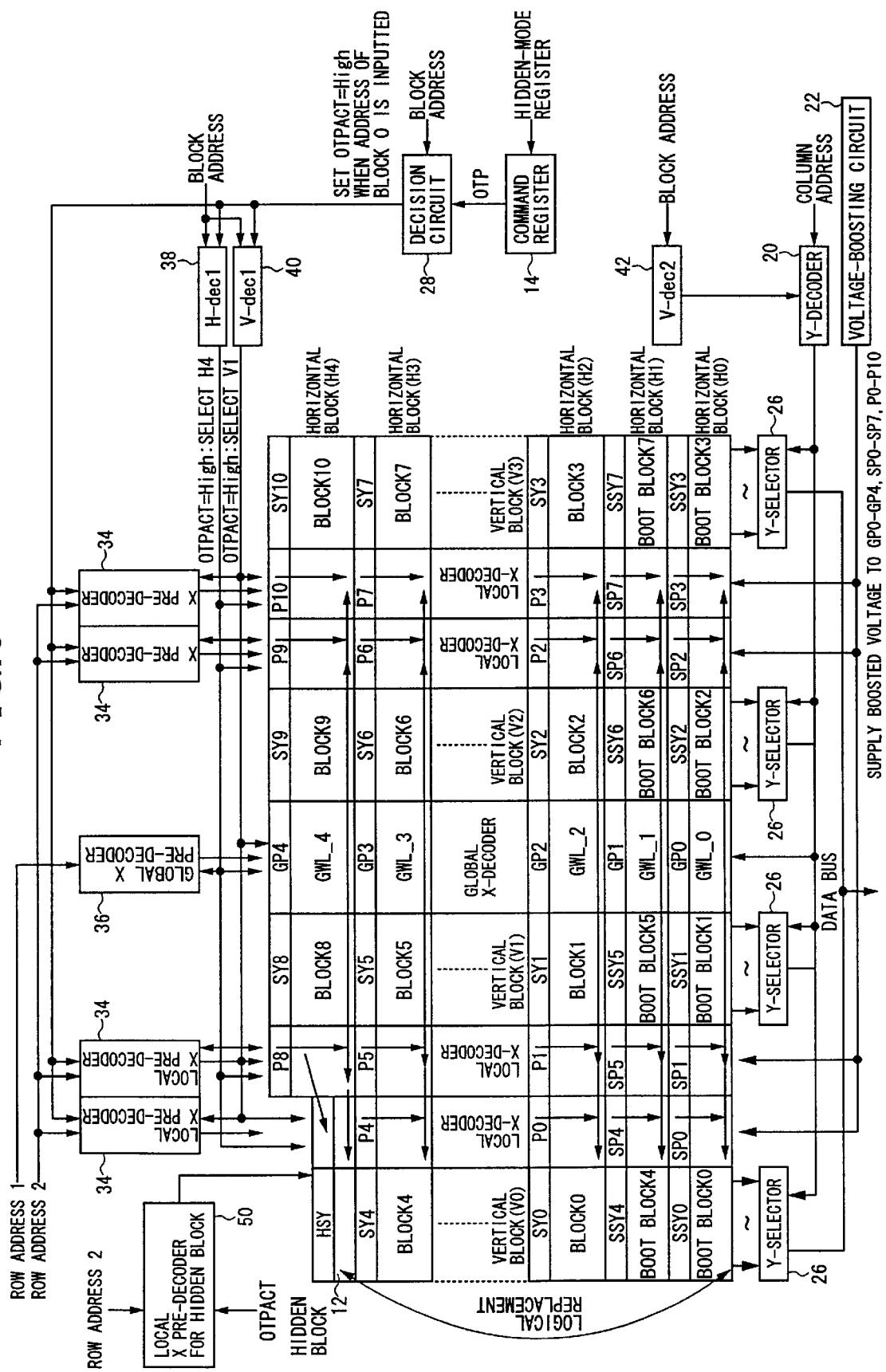
FIG. 6 is a block diagram showing the semiconductor memory device according to a second embodiment of the present invention.

FIG. 6 is a block diagram showing a semiconductor memory device according to a second embodiment of the present invention. A segmental word line method is adapted to a flash memory shown in FIG. 6 as a method of decoding a word line in the flash memory. A structure of the flash memory shown in FIG. 6 is almost the same as the flash memory shown in FIG. 3 except for a composition of X-decoders. In the regular mode, a local X pre-decoder 50 used for the hidden block 12 is deactivated so that a word line for the hidden block 12 cannot be selected. A horizontal-block selecting decoder (H-dec 1) 38 and a vertical-block selecting decoder (V-dec 1) 40 select a local X-decoder corresponding to a block address of a block. In addition, a global X-decoder and a boosted-voltage supply circuit are selected.

On a column side of the flash memory, a vertical-block selecting decoder (H-dec 2) 42 selects a vertical block corresponding to the block address of the block, and then a Y-decoder 20 corresponding to the selected vertical block. The Y-decoder 20 selects a Y-selector 26 corresponding to the vertical block that has been selected by use of a column address of the block. In a data reading process, a boosted voltage generated by the voltage-boosting circuit 22 is supplied to a global boosted-voltage supply circuit and to a block selected by the boosted-voltage supply circuit, and thus a voltage level at a word line corresponding to row addresses 1 and 2 increases to the boosted voltage level. Consequently, data is read from a memory cell in the block, and is outputted to a data bus through the Y-selector 26 corresponding to the vertical block that has been selected according to a column address of the block.

On the other hand, in the hidden mode, the hidden block 12 is swapped logically with any block provided in the same column as the hidden block 12 in the flash memory similarly to the flash memory shown in FIG. 3. In this embodiment, the highest or the lowest block in the same column as the hidden block 12 is preferred to be a block logically swapped with the hidden block 12. Additionally, a memory capacity of the block to be logically swapped with the hidden block 12 is preferred to be small enough so that a memory capacity for other use increases in the flash memory. Accordingly, the boot block 0 is selected as a block logically swapped with the hidden block 12 in this embodiment. Accordingly, blocks are arranged in the flash memory so that the hidden block 12 and the boot block 0 are located in the same column.

Figure 7A:
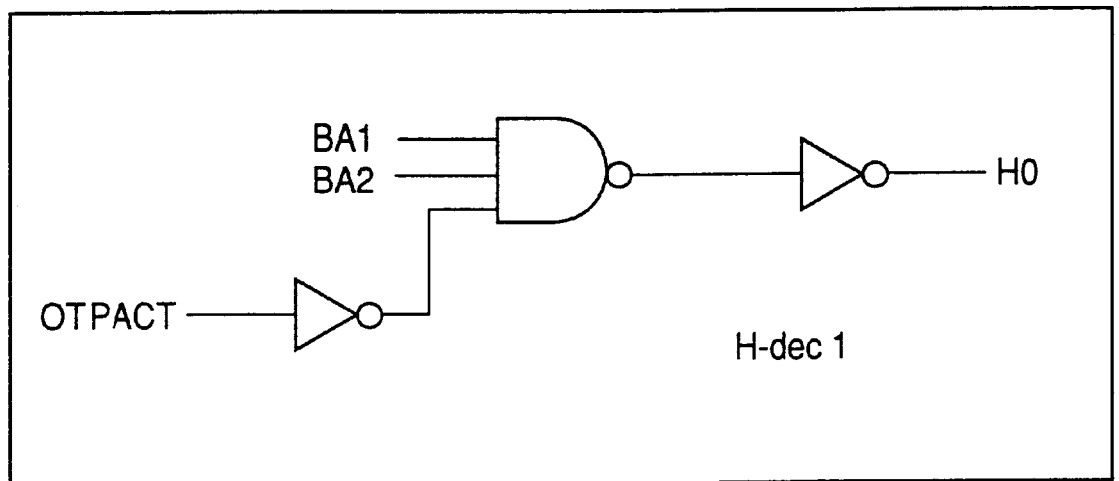
FIGS. 7A and 7B are circuit diagrams showing block-selecting decoders.
Figure 7B:
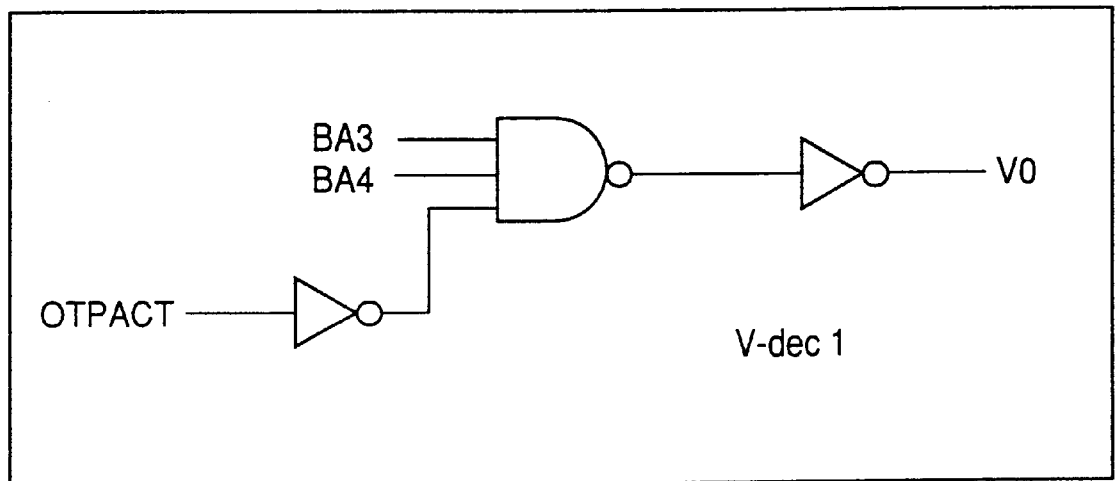

The hidden block 12 is selected by the following steps. Initially, a hidden-mode command is inputted to the command register 14. Subsequently, an address of the boot block 0 is inputted to the decision circuit 28. Additionally, the signal OTP set high indicating that the hidden mode has been selected is supplied from the command register 14 to the decision circuit 28. Consequently, the decision circuit 28 outputs the signal OTPACT set high indicating selection of the hidden block 12. The horizontal-block selecting decoder 38 selects a horizontal block H4 after receiving the signal OTPACT set high from the decision circuit 28. The vertical-block selecting decoder 40 selects the vertical block V1 after receiving the signal OTPACT set high from the decision circuit 28. FIG. 7A and FIG. 7B shows a circuit structure of the horizontal-block selecting decoder 38 and a circuit structure of the vertical-block selecting decoder 40 respectively. Local X pre-decoders 34 are deactivated when receiving the signal OTPACT set high from the decision circuit 28. Meanwhile, the local X pre-decoder 50 for the hidden block 12 is activated after receiving the signal OTPACT set high from the decision circuit 28, and selects a word line following the row address 2.

On the other hand, when receiving the signal OTP set high indicating the hidden mode from the command register 14 and a block address other than the address of the boot block 0, the decision circuit 28 does not output the signal OTPACT set high, and thus a block corresponding the block address is selected regularly. In addition, since the hidden block 12 and the boot block 0 are placed in the same column of the flash memory, the hidden block 12 can be selected in the vertical direction by use of the block address of the boot block 0.

Figure 8:
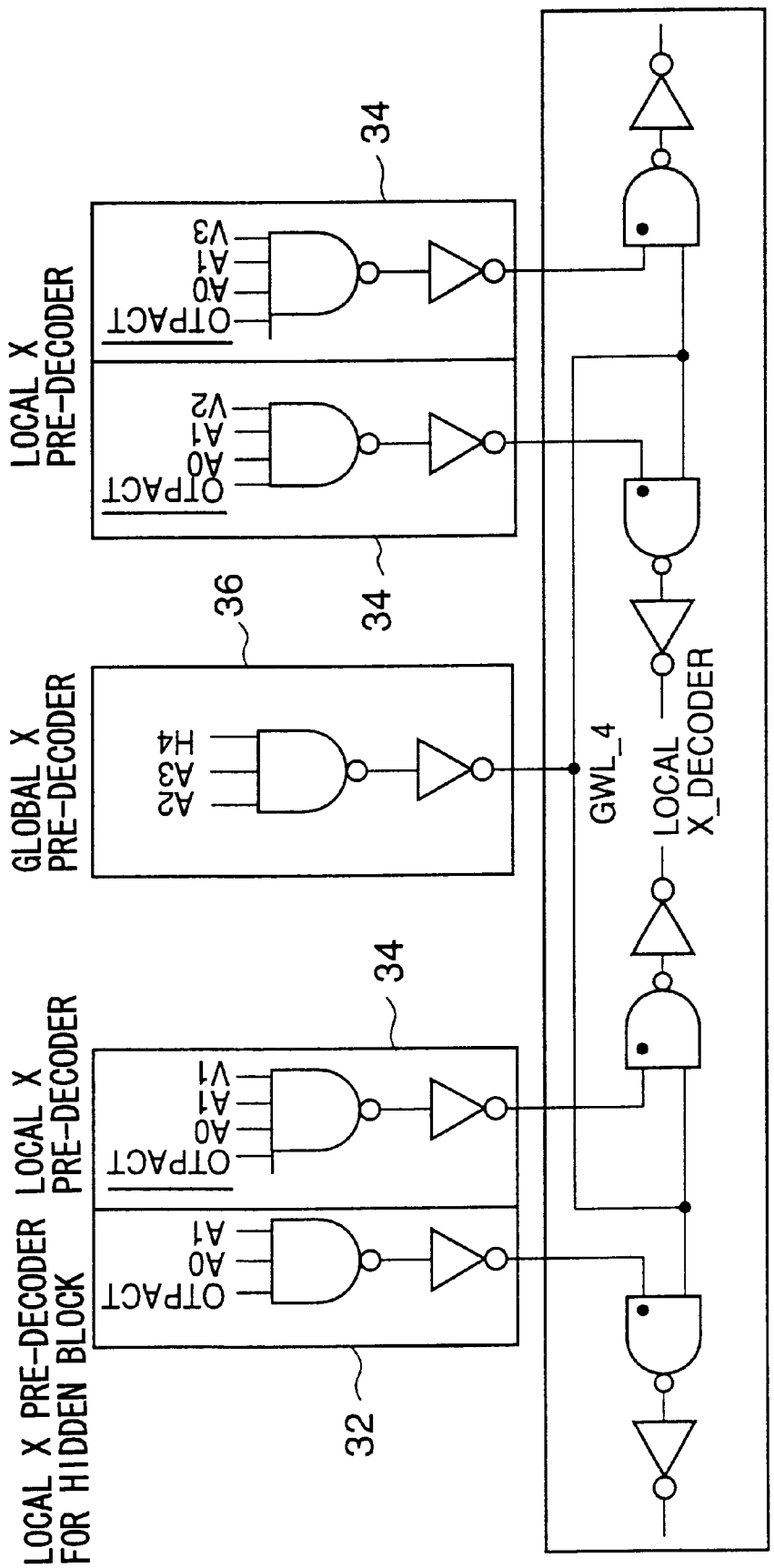
FIG. 8 is a circuit diagram showing a signal-dividing logic circuit at a horizontal block.

FIG. 8 is a circuit diagram showing a signal-dividing logic circuit at the horizontal block H4. A global X pre-decoder 36 shown in FIG. 8 selects a global word line GWL_4 following the signal OTPACT supplied from the horizontal-block selecting decoder 38 and the row address 1. The local X pre-decoder 34 selects a block following the signal OTPACT supplied from the vertical-block selecting decoder 40 and the row address 2. The global word line GWL_4 is shared among the blocks 8, 9 and 10 in the horizontal direction.

The hidden block 12 does not have its corresponding boosted-voltage supply circuit, and thus uses the boosted-voltage supply circuit P8 of the adjacent block 8 similarly to the flash memory shown in FIG. 3. In other words, an X-decoder of the hidden block 12 receives the boosted voltage through the boosted-voltage supply circuit P8. A memory area of the hidden block 12 is small enough compared to that of the blocks in the main memory area, and thus the load capacitance corresponding to the hidden block 12 does not change much. Therefore, a value of the boosted voltage used for reading data from the hidden block 12 becomes substantially equal to a value of the boosted voltage used for reading data from the blocks. Accordingly, adjustment of a capacitor used for boosting voltage can be easily executed. Additionally, when reading data from the hidden block 12, the boosted-voltage supply circuit P8 is not activated since the vertical block V0 is selected. Accordingly, when reading data from the hidden block 12, the horizontal-block selecting decoder 38 and the vertical-block selecting decoder 40 must be controlled so that the block 8 can be selected following the signal OTPACT set high.

Furthermore, when the boosted-voltage supply circuit P8 is activated, word lines of the hidden block 12 and the block 8 are selected. In order to prevent selection of both word lines, the local X pre-decoder 34 should be deactivated while the signal OTPACT set high is outputted from the decision circuit 28. When selecting the block 8 in the hidden mode, the signal OTPACT set high is not outputted from the decision circuit 28, and thus the local X pre-decoder 50 for the hidden block 12 is deactivated. On the other hand, when selecting the block 8 in the regular mode, data is not read from the hidden block 12 since the vertical block V1 is selected.

As described above, in the flash memory whereto the segmental word line method is applied, a block other than the hidden block 12 can be selected in the hidden mode with few modifications in the circuit structure of the flash memory by providing the hidden block 12 in an empty space of the matrix structure of the blocks, and then by swapping the hidden block 12 logically with a block in the matrix structure.

According to the second embodiment of the present invention, a column of the hidden block 12 can be easily selected just by inputting a block address of any block in the main memory area of the flash memory because of logically swapping the hidden block 12 with the block. Additionally, a block provided in the main memory area can be easily selected in the hidden mode with few modifications in the circuit structure of the flash memory.

By placing the hidden block 12 in an empty space inside the matrix structure of the blocks, a part of a bit line can be shared between the hidden block 12 and a block in the main memory area, and thus a area size of a flash memory chip is reduced. Additionally, by sharing a part of a global word line among the hidden block 12 and the other blocks, a load on the global word line becomes the same for the hidden block 12 and the other blocks. Accordingly, the effect on the boosted voltage used for reading data from the hidden block 12 is reduced. Additionally, a global word line decoder can be shared among the hidden block 12 and the other blocks so that the area size of the flash memory chip can be reduced. Furthermore, by sharing a word-line operating power source (boosted-voltage supply circuit) of a block in the main memory area with the hidden block 12, a load capacitance for reading data from the block in the main memory area and a load capacitance for reading data from the hidden block 12 becomes almost equal. Therefore, boosted voltages for reading data from the block in the main memory area and from the hidden block 12 can be set equal to each other.

According to the present invention, selection of a memory address of a memory area located outside a main memory area is efficiently executed in a flash memory. Additionally, a period for designing such an efficient circuit is shortened. Furthermore, reliability of operations at a low voltage in the flash memory is increased.

The above description is provided in order to enable any person skilled in the art to make and use the invention and sets forth the best mode contemplated by the inventors of carrying out the invention.

The present invention is not limited to the specially disclosed embodiments and variations, and modifications may be made without departing from the scope and spirit of the invention.

The present application is based on Japanese Priority Application No. 2000-054824, filed on Feb. 29, 2000, the entire contents of which are hereby incorporated by reference.

What is claimed is:

1. A semiconductor memory device comprising:

a primary memory area including a plurality of memory blocks arranged in rows and columns, said plurality of memory blocks including a predetermined memory block;

a secondary memory area including a hidden memory block situated in the same column as said predetermined memory block;

a decision circuit selecting one of a first mode for reading first data from the primary memory area and a second mode for reading second data from the secondary memory area, said decision circuit outputting a signal when the second mode and an address of said predetermined memory block are specified;

a column decoder selecting a column corresponding to a column address inputted thereto; and a word-line decoder selecting a word line of said hidden memory block by boosting a word line of an adjacent memory block included in the primary memory area in response to the signal, said word-line decoder being included in said adjacent memory block, wherein the second data is read from said hidden memory block when said column decoder and said word-line decoder select the column corresponding to said hidden memory block and the word line of said hidden memory block respectively.

2. The semiconductor memory device as claimed in claim 1, wherein said adjacent memory block includes a power source used for operating the word line of said adjacent memory block, said power source being used for selecting the word line of said hidden memory block.

3. The semiconductor memory device as claimed in claim 1, wherein said plurality of memory blocks are arranged in a matrix structure, wherein the secondary memory area is provided in an empty space in said matrix structure.

4. A semiconductor memory device from which data is read by use of a segmental word line method, said semiconductor memory device comprising:

a primary memory area including a plurality of memory blocks arranged in rows and columns, said plurality of memory blocks including a predetermined memory block;

a secondary memory area including a hidden memory block situated in the same column as said predetermined memory block;

a decision circuit selecting one of a first mode for reading first data from the primary memory area and a second mode for reading second data from the secondary memory area, said decision circuit outputting a signal when the second mode and an address of said predetermined memory block are specified;

a column decoder selecting a column corresponding to a column address inputted thereto;

a global-word-line decoder selecting a global word line of a row corresponding to a first row address when receiving the signal and the first row address, said global word line being connected to said hidden memory block and an adjacent memory block included in the primary memory area; and a local-word-line decoder selecting said hidden memory block by boosting a word line of said hidden memory block when receiving the signal and a second row address corresponding to the word line of said hidden memory block, wherein the second data is read from said hidden memory block when said global-word-line decoder, said local-word-line decoder and said column decoder select the global word line, the word line of said hidden memory block and the column corresponding to said hidden memory block respectively.

5. The semiconductor memory device as claimed in claim 4, wherein said adjacent memory block includes a power source used for operating a word line of said adjacent memory block, said power source being used for selecting the word line of said hidden memory block.

6. The semiconductor memory device as claimed in claim 4, wherein said plurality of memory blocks are arranged in a matrix structure in the primary memory area, wherein the secondary memory area is provided in an empty space in said matrix structure.

* * * * *